(12) United States Patent
Tsujihashi et al.

(10) Patent No.: US 12,312,184 B2
(45) Date of Patent: May 27, 2025

(54) SUBSTRATE TRANSFER DEVICE AND SUBSTRATE TRANSFER METHOD

(71) Applicant: Tokyo Electron Limited, Tokyo (JP)

(72) Inventors: Tatsuhiko Tsujihashi, Kumamoto (JP); Suguru Enokida, Kumamoto (JP); Kazuki Matsushita, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 311 days.

(21) Appl. No.: 17/864,722

(22) Filed: Jul. 14, 2022

(65) Prior Publication Data

US 2023/0017389 A1 Jan. 19, 2023

(30) Foreign Application Priority Data

Jul. 15, 2021 (JP) ................................ 2021-117051

(51) Int. Cl.
*B65G 47/91* (2006.01)
*B65G 49/06* (2006.01)

(52) U.S. Cl.
CPC ........... *B65G 49/061* (2013.01); *B65G 47/91* (2013.01); *B65G 49/067* (2013.01); *B65G 2201/0297* (2013.01)

(58) Field of Classification Search
CPC .. B65G 47/91; B65G 47/918; H01L 21/67754
See application file for complete search history.

(56) References Cited

U.S. PATENT DOCUMENTS

| 6,065,789 | A | * | 5/2000 | Nagai | .................. | B25J 15/0641 |
| | | | | | | 294/185 |
| 6,102,459 | A | * | 8/2000 | Pabst | .................... | B66C 1/0293 |
| | | | | | | 294/185 |
| 6,131,973 | A | * | 10/2000 | Trudeau | ............... | B65G 47/917 |
| | | | | | | 294/186 |
| 6,517,050 | B1 | * | 2/2003 | Pabst | .................... | B65G 47/91 |
| | | | | | | 251/339 |
| 7,878,564 | B2 | * | 2/2011 | Kang | .................. | H01L 21/6838 |
| | | | | | | 294/186 |
| 8,920,103 | B2 | * | 12/2014 | Schaller | .................... | B25J 9/10 |
| | | | | | | 901/17 |

FOREIGN PATENT DOCUMENTS

| JP | 2012-199282 A | 10/2012 |
| JP | 2017-224657 A | 12/2017 |

* cited by examiner

*Primary Examiner* — Jonathan Snelting
(74) *Attorney, Agent, or Firm* — Venjuris, P.C.

(57) ABSTRACT

A substrate transfer device includes a substrate holder and a base to which the substrate holder is movably attached. The substrate holder includes first and second suction holes provided to be open in a placing surface, first and second protrusions disposed respectively in the first and second suction holes, and first and second supports provided respectively in the vicinity of the first and second suction holes so as to protrude upward from the placing surface. The first protrusion is pressed by a first elastic member toward an upward direction to protrude from the first suction hole such that the first protrusion blocks the first suction hole, and the second protrusion is pressed by a second elastic member toward an upward direction to protrude from the second suction hole such that the second protrusion blocks the second suction hole.

15 Claims, 14 Drawing Sheets

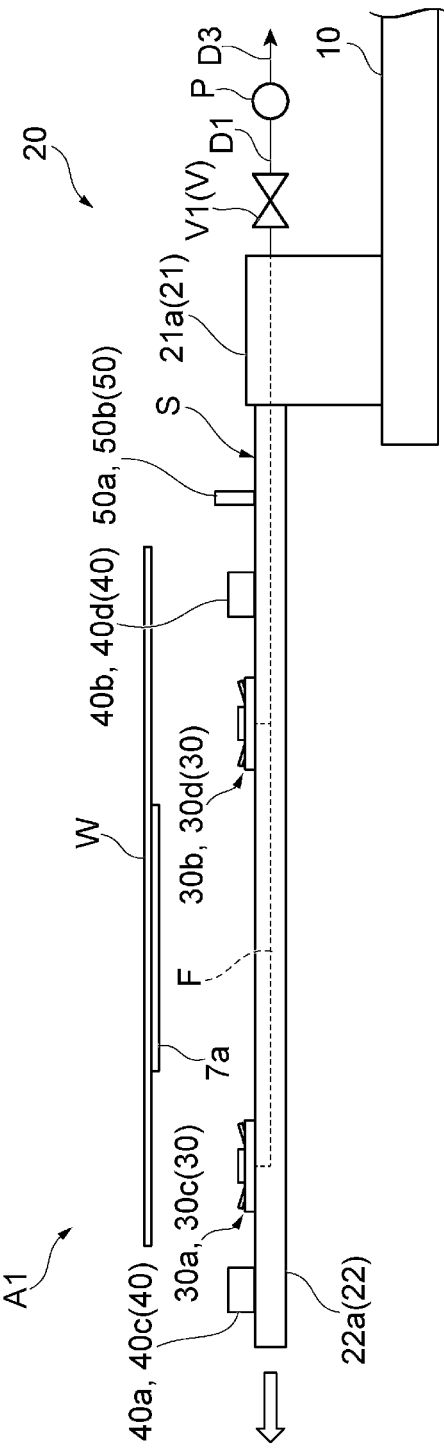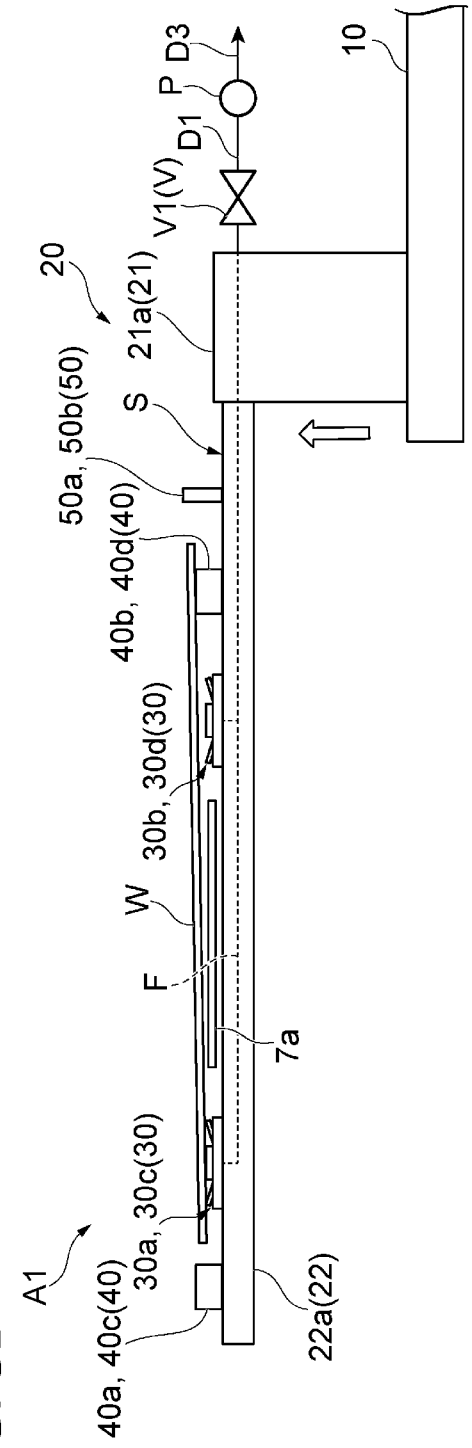

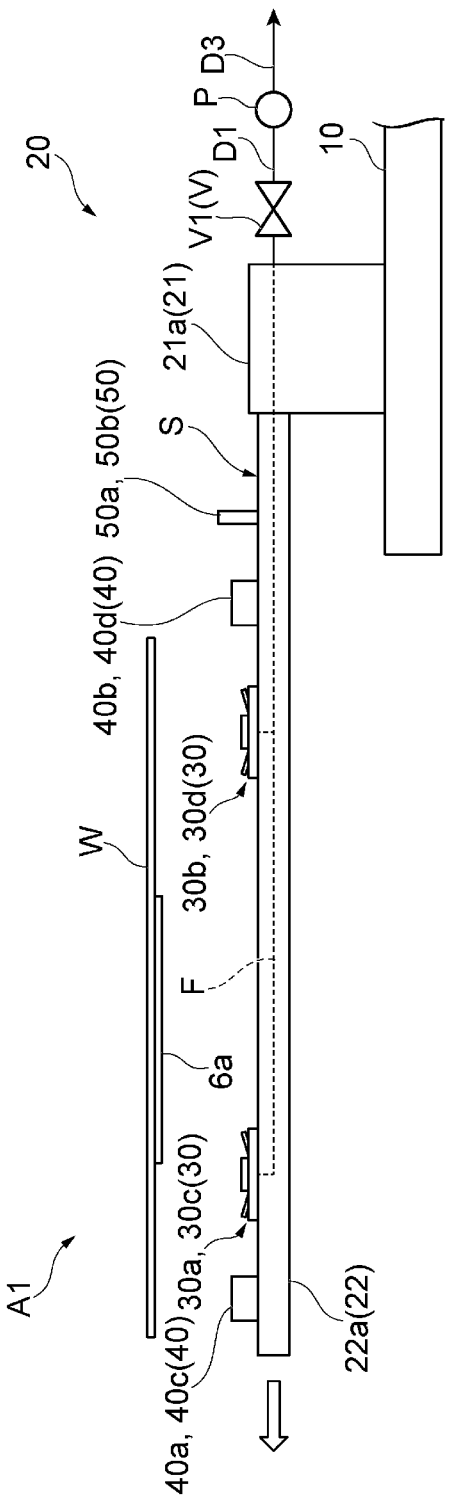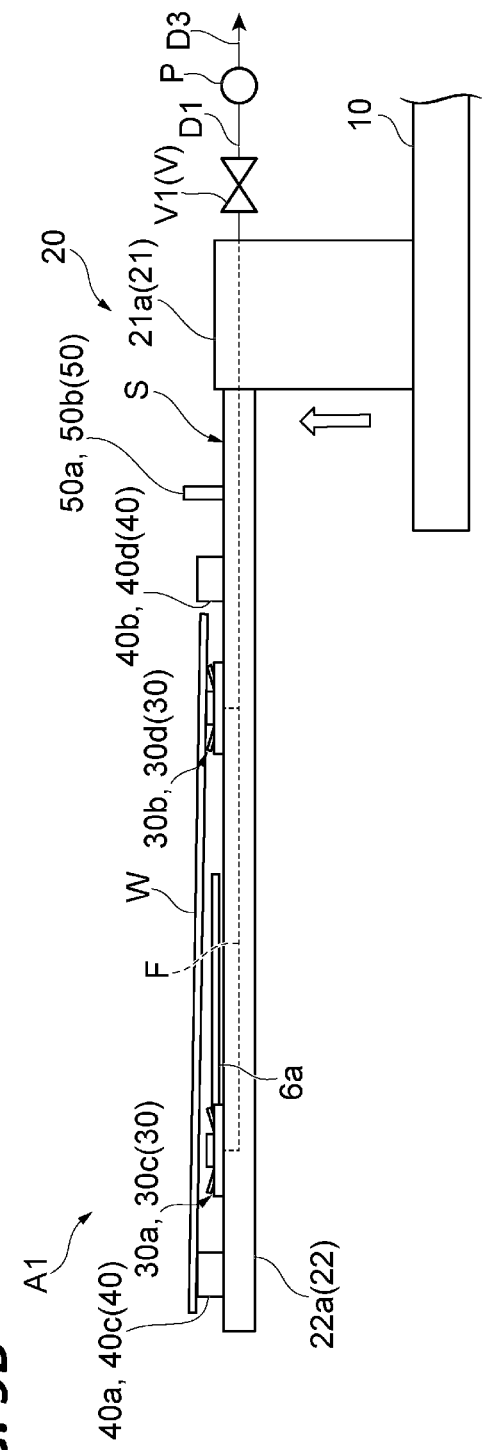

SUBSTRATE TRANSFER DEVICE AND SUBSTRATE TRANSFER METHOD

CROSS-REFERENCE TO RELATED APPLICATIONS

This application is based on and claims priority from Japanese Patent Application No. 2021-117051, filed on Jul. 15, 2021 with the Japan Patent Office, the disclosure of which is incorporated herein in its entirety by reference.

TECHNICAL FIELD

The present disclosure relates to a substrate transfer device and a substrate transfer method.

BACKGROUND

Japanese Patent Laid-Open Publication Nos. 2017-224657 and 2012-199282 disclose a substrate processing system including a processing module configured to process a substrate such as a semiconductor wafer, a carrier configured to accommodate the substrate, and a substrate transfer device configured to be movable between the processing module and the carrier. The substrate transfer device transfers the substrate to the processing module or to the carrier while holding the substrate taken out from the carrier with a transfer arm.

SUMMARY

According to an aspect of the present disclosure, a substrate transfer device includes a substrate holder configured to hold a substrate and a base to which the substrate holder is movably attached such that the substrate holder is able to move in a horizontal direction. The substrate holder includes a placing surface that faces a back surface of the substrate in a state where the substrate is held pm the substrate holder, a first suction hole and a second suction hole provided to be open in the placing surface, a suction flow path connected to the first suction hole and the second suction hole, a first protrusion disposed in the first suction hole, a second protrusion disposed in the second suction hole, a first support provided in a vicinity of the first suction hole so as to protrude upward from the placing surface, and a second support provided in a vicinity of the second suction hole so as to protrude upward from the placing surface. The first protrusion is pressed by a first elastic member toward an upward direction to protrude from the first suction hole toward the upward direction such that the first protrusion is configured to block the first suction hole in a state where the substrate is not held. The second protrusion is pressed by a second elastic member toward the upward direction to protrude from the second suction hole toward the upward direction such that the second protrusion is configured to block the second suction hole in a state where the substrate is not held.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 8A and 8B are views illustrating a method of delivering a substrate at a first advance position.

FIGS. 9A and 9B are views illustrating a method of delivering a substrate at a second advance position.

DESCRIPTION OF EMBODIMENT

Figure 1:
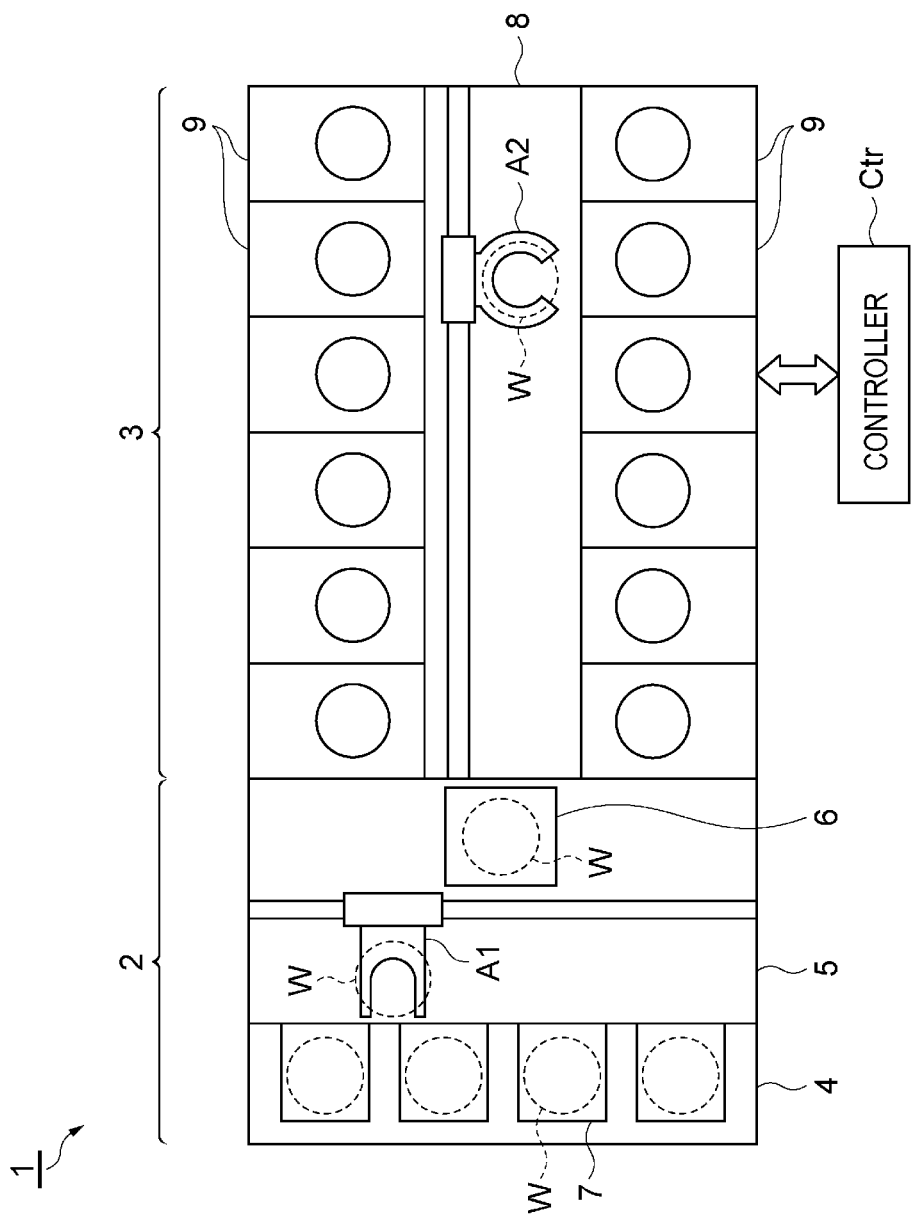
FIG. 1 is a plan view schematically illustrating an example of a substrate processing system.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

In the following description, the same reference numerals will be used for the same elements or elements having the same functions, and the duplicated description thereof will be omitted. In this specification, when referring to the top, bottom, right, and left in the drawings, it will be on the basis of the direction of the signs in the drawings.

[Substrate Processing System]

First, a substrate processing system 1 configured to process a substrate W will be described with reference to FIGS. 1 and 2. The substrate processing system 1 includes a carry-in/out station 2, a processing station 3, and a controller Ctr (a control unit). The carry-in/out station 2 and the processing station 3 may be lined up in a row, for example, in the horizontal direction.

The substrate W may have a disk shape, or may have a plate shape other than a circle such as a polygon. The substrate W may have a cutout portion obtained by cutting out a portion thereof. The cutout portion may be, for example, a notch (e.g., a U-shaped or V-shaped groove), or may be a straight portion extending in a straight line shape (so-called orientation flat). The substrate W may be, for example, a semiconductor substrate (silicon wafer), a glass substrate, a mask substrate, a flat panel display (FPD) substrate, or various other substrates. The diameter of the substrate W may be, for example, about 200 mm to 450 mm.

The carry-in/out station 2 includes a placing section 4, a carry-in/out section 5, and a shelf unit 6. The placing section 4 includes a plurality of stages (not illustrated) lined up in the width direction (the top-to-bottom direction in FIG. 1). Each stage is configured to enable a carrier 7 (an accommodating container) to be placed thereon. The carrier 7 is configured to accommodate at least one substrate W in a sealed state. The carrier 7 includes a pair of sidewalls 7b provided with a plurality of inwardly protruding support pieces 7a, as illustrated in FIG. 2. Each of the support pieces 7a extends in the horizontal direction, and is configured to support a peripheral edge portion of the substrate W from the back surface side of the substrate W. The carrier 7 includes an opening/closing door (not illustrated) for loading or unloading the substrate W.

Figure 2:
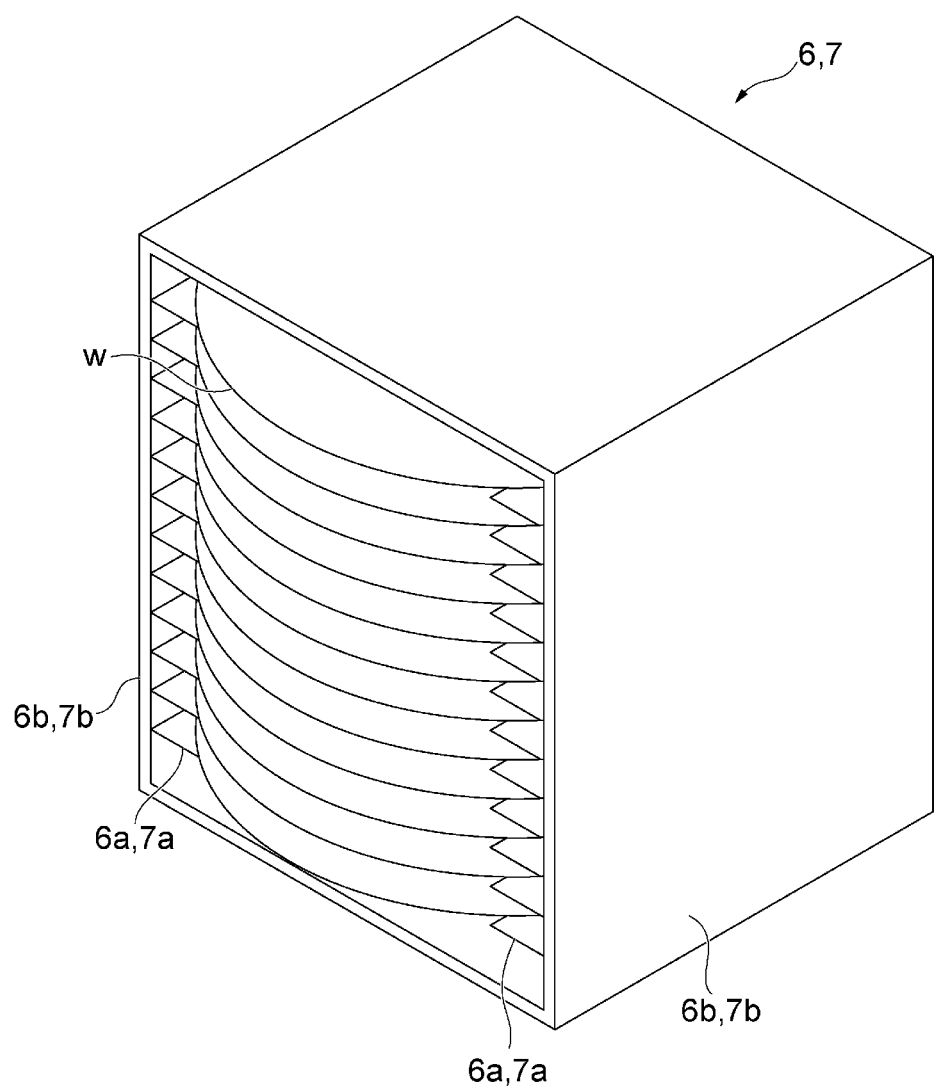
FIG. 2 is a perspective view illustrating an example of a shelf unit and a carrier.

The carry-in/out section 5 is arranged adjacent to the placing section 4 in the direction in which the carry-in/out station 2 and the processing station 3 are lined up (the left-to-right direction in FIG. 1). The carry-in/out section 5 includes an opening/closing door (not illustrated) provided corresponding to the placing section 4. In a state where the carrier 7 is placed on the placing section 4, the opening/closing door of the carrier 7 and the opening/closing door of the carry-in/out section 5 are opened together, so that the inside of the carry-in/out section 5 communicates with the inside of the carrier 7.

The carry-in/out section 5 incorporates a substrate transfer device A1 and the shelf unit 6. The substrate transfer device A1 is configured to take out the substrate W from the carrier 7 and deliver it to the shelf unit 6 and to receive the substrate W from the shelf unit 6 and return it to the carrier 7. The shelf unit 6 is located in the vicinity of the processing station 3, and is configured to mediate the delivery of the substrate W between the carry-in/out section 5 and the processing station 3. The shelf unit 6 is configured to accommodate at least one substrate W. The shelf unit 6 may be configured in the same manner as the carrier 7. That is, the shelf unit 6 may include a pair of sidewalls 6b provided with a plurality of inwardly protruding support pieces 6a, as illustrated in FIG. 2. Each of the support pieces 6a may extend in the horizontal direction, and may be configured to support a peripheral edge portion of the substrate W from the back surface side of the substrate W.

The processing station 3 includes a transfer section 8 and a plurality of processing units 9. The transfer section 8 extends horizontally, for example, in the direction (the left-to-right direction in FIG. 1) in which the carry-in/out station 2 and the processing station 3 are lined up. The transfer section 8 incorporates a substrate transfer device A2. The substrate transfer device A2 is configured to be able to perform a horizontal movement in the longitudinal direction (the left-to-right right direction in FIG. 1) of the transfer section 8, a vertical movement in the vertical direction, and a turning operation around the vertical axis. The substrate transfer device A2 is configured to take out the substrate W from the shelf unit 6 and deliver it to each processing unit 9 and to receive the substrate W from each processing unit 9 and return it to the shelf unit 6. A configuration of the substrate transfer device A2 may be the same as that of the substrate transfer device A1.

The plurality of processing units 9 are arranged so as to be lined up in a row along the longitudinal direction (the left-to-right direction in FIG. 1) of the transfer section 8 on each of opposite sides of the transfer section 8. The processing unit 9 is configured to perform a predetermined processing on the substrate W (e.g., a cleaning processing of the substrate W or an etching processing of a film formed on the surface of the substrate W).

The controller Ctr is configured to partially or wholly control the substrate processing system 1. The controller Ctr may read a program from a computer readable recording medium, generate a signal for operating respective parts of the substrate processing system 1 (e.g., the substrate transfer devices A1 and A2 and the processing unit 9) according to the program, and transmit the signal to the respective parts. The recording medium may be, for example, a semiconductor memory, an optical recording disk, a magnetic recording disk, or a magneto-optical recording disk.

[Substrate Transfer Device]

Figure 3:
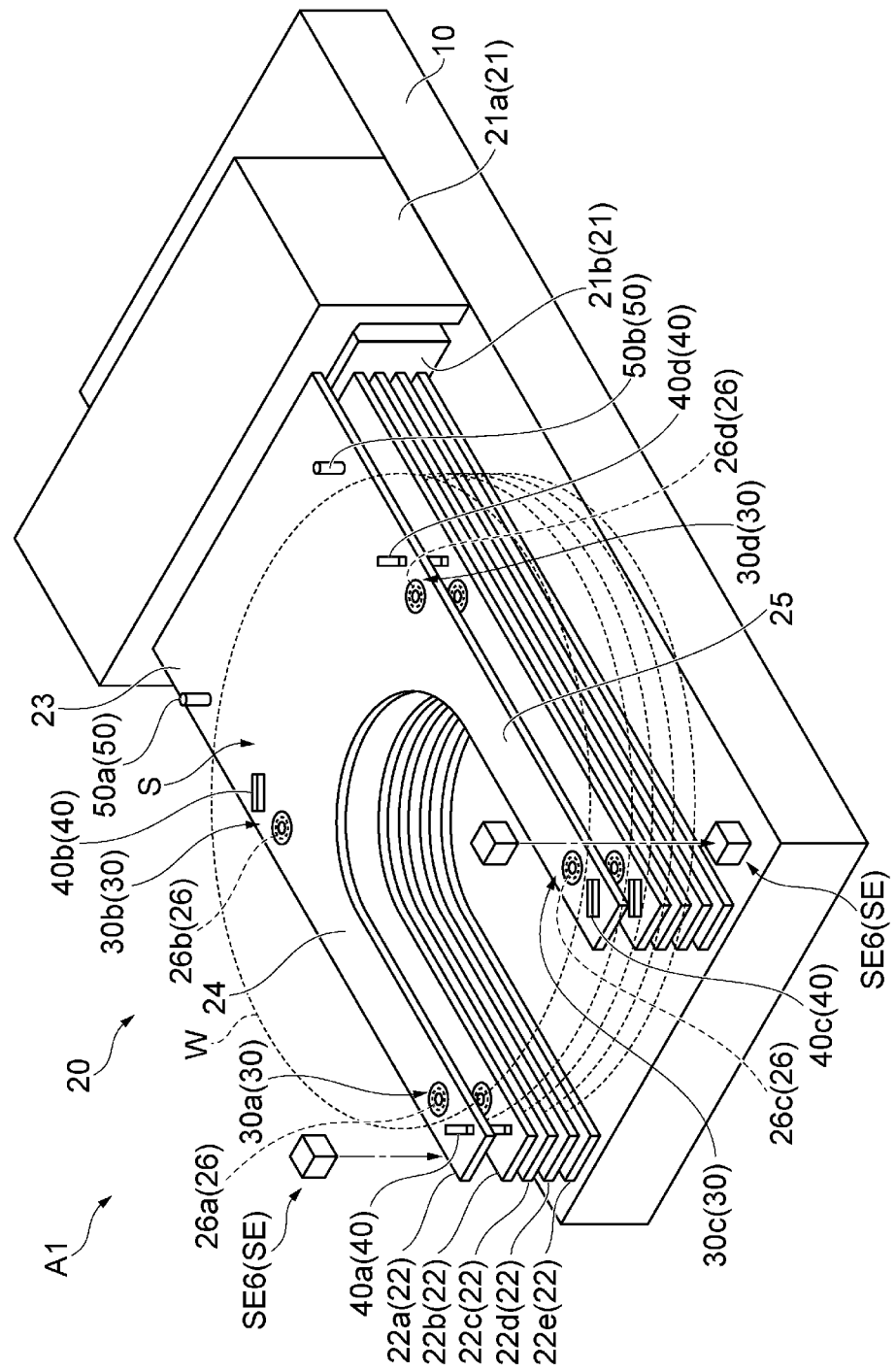
FIG. 3 is a perspective view illustrating an example of a substrate transfer device.
Figure 4:
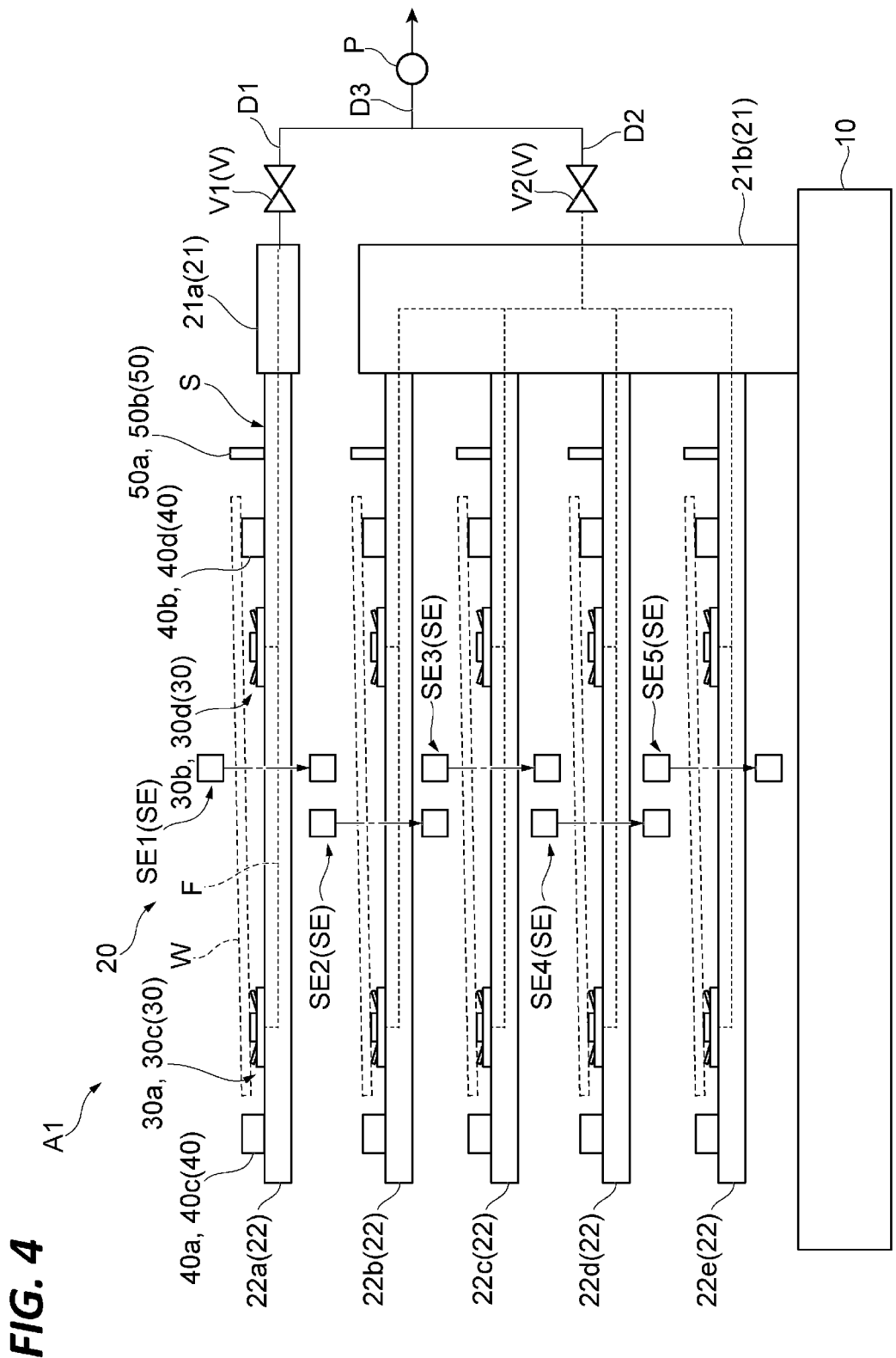
FIG. 4 is a side view illustrating an example of a substrate transfer device.

Subsequently, the configuration of the substrate transfer device A1 will be described in more detail with reference to FIGS. 3 to 7. As illustrated in FIGS. 3 and 4, the substrate transfer device A1 includes a base 10, a substrate holding unit 20, and a plurality of detecting units SE. The base 10 is configured to be able to perform a horizontal movement in the width direction (the top-to-bottom direction in FIG. 1) of the carry-in/out section 5, a vertical movement in the vertical direction, and a turning operation around the vertical axis.

The substrate holding unit 20 is configured to hold one or more substrates W. When holding a plurality of substrates W, the substrate holding unit 20 is configured to hold the substrates W in multiple stages in the vertical direction. The substrate holding unit 20 includes, for example, one or more moving mechanisms 21, one or more transfer arms 22, one or more valves V, and a suction pump P.

In the example of FIG. 3, the one or more moving mechanisms 21 include two moving mechanisms 21a and 21b. The moving mechanisms 21a and 21b are attached to the base 10. The moving mechanisms 21a and 21b are configured to operate independently of each other based on a signal from the controller Ctr and to horizontally move along the longitudinal direction of the base 10. The moving mechanism 21a may be located above the moving mechanism 21b.

In the example of FIG. 3, the one or more transfer arms 22 include five transfer arms 22a to 22e. The transfer arm 22a is attached to the moving mechanism 21a. The transfer arms 22b to 22e are attached to the moving mechanism 21b so as to be lined up in the vertical direction in this order from top to bottom. Therefore, when the moving mechanisms 21a and 21b horizontally move with respect to the base 10 at the same time, the five transfer arms 22a to 22e also horizontally move at the same time. When only the moving mechanism 21a horizontally moves with respect to the base 10, the transfer arm 22a horizontally moves, but the transfer arms 22b to 22e do not move. When only the moving mechanism 21b horizontally moves with respect to the base 10, the transfer arms 22b to 22e horizontally move, but the transfer arm 22a does not move.

Figure 5:
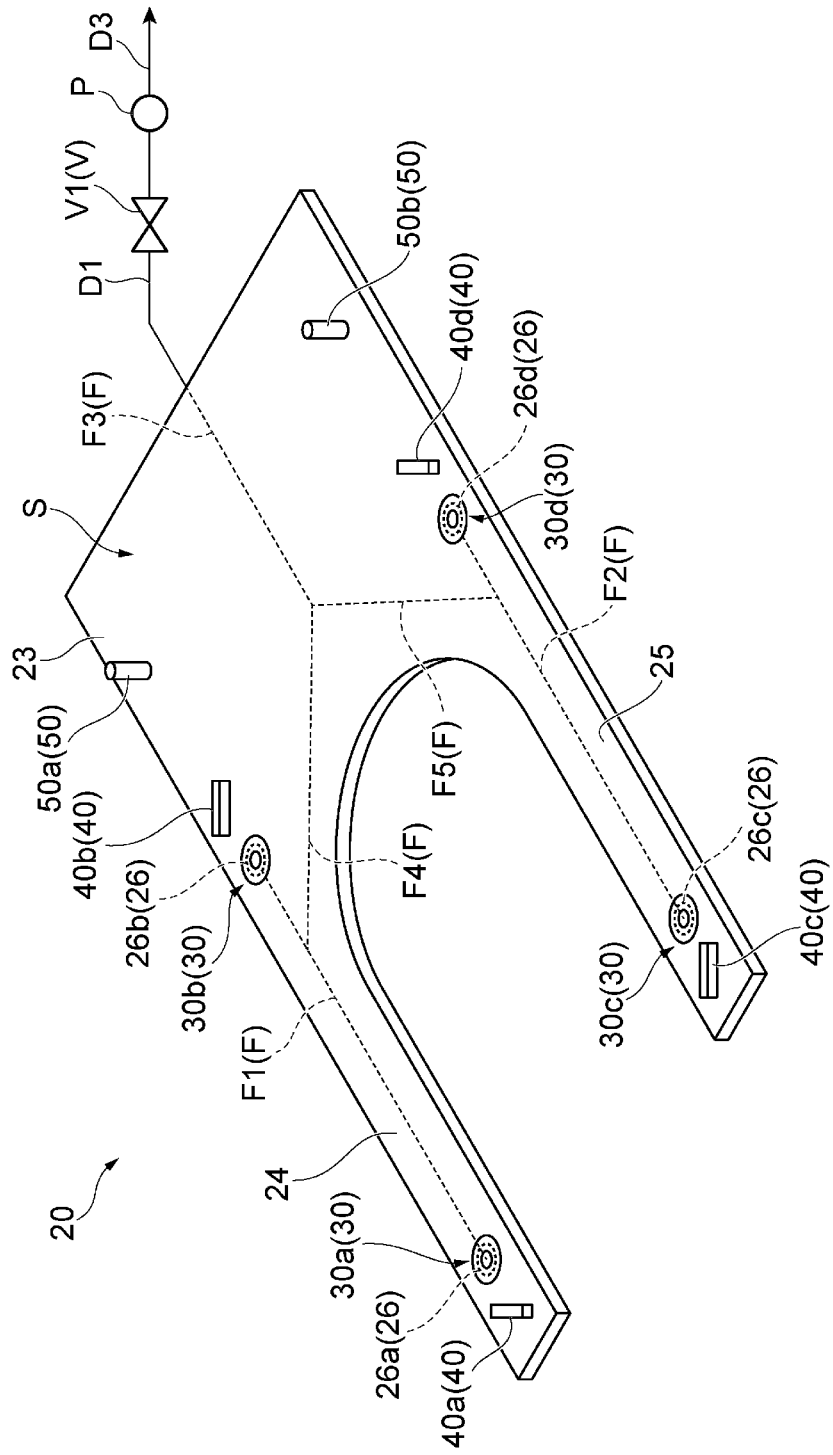
FIG. 5 is a perspective view illustrating an example of a transfer arm.

The transfer arm 22 may have a plate shape, as illustrated in FIGS. 3 to 5. The transfer arm 22 may be made of, for example, a ceramic material. The transfer arm 22 includes a base portion 23 and a pair of arm portions 24 and 25. The base portion 23 has a rectangular shape, and is attached to the moving mechanism 21. The pair of arm portions 24 and 25 bifurcate and extend from the base portion 23. The upper surface S of the transfer arm 22 is configured to face the back surface of the substrate W in a state where the substrate W is held by the substrate holding unit 20. That is, the upper surface S of the transfer arm 22 functions as a placing surface on which the substrate W is placed.

Figure 6:
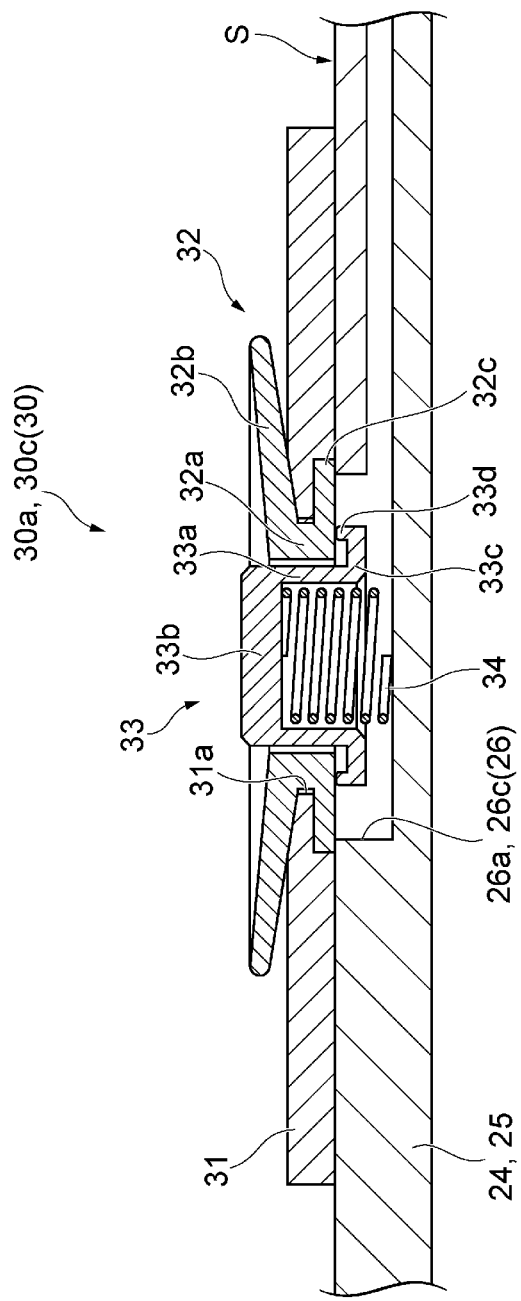
FIG. 6 is a cross-sectional view partially illustrating an example of a transfer arm.

A plurality of suction holes 26 are formed in the upper surface S of the transfer arm 22. In the examples of FIGS. 3, 5 and 6, four suction holes 26a to 26d are formed in the upper surface S of the transfer arm 22 so as to be opened. The suction hole 26a (a first suction hole) is located in the tip end of the arm portion 24. The suction hole 26b (a second suction hole) is located in a region of the base portion 23 near the base end of the arm portion 24. The suction hole 26c (a first suction hole) is located in the tip end of the arm portion 25. The suction hole 26d (a second suction hole) is located in a region of the base portion 23 near the base end of the arm portion 25.

A plurality of suction units 30 are formed on the upper surface S of the transfer arm 22. In the examples of FIGS. 3 to 6, four suction units 30a to 30d are formed on the upper surface S of the transfer arm 22. The suction unit 30a is attached to the suction hole 26a so as to cover the suction hole 26a. The suction unit 30b is attached to the suction hole 26b so as to cover the suction hole 26b. The suction unit 30c is attached to the suction hole 26c so as to cover the suction hole 26c. The suction unit 30d is attached to the suction hole 26d so as to cover the suction hole 26d.

A plurality of supports 40 are formed on the upper surface S of the transfer arm 22. The support 40 is configured to support the substrate W by coming into contact at the upper end thereof with the back surface of the substrate W. The height position of the upper end of the support 40 is set to be higher than the suction unit 30. The support 40 may be, for example, a ridge extending along the width direction of the transfer arm 22. The support 40 may be made of, for example, rubber.

In the examples of FIGS. 3 to 5, four supports 40a to 40d are formed on the upper surface S of the transfer arm 22. The support 40a (a first support) is located closer to the tip end of the arm portion 24 than the suction unit 30a and in the vicinity of the suction unit 30a. The support 40b (a second support) is located in a region of the base portion 23 closer to the base end of the arm portion 24 than the suction unit 30b and in the vicinity of the suction unit 30b. The support 40c (a first support) is located closer to the tip end of the arm portion 25 than the suction unit 30c and in the vicinity of the suction unit 30c. The support 40d (a second support) is located in a region of the base portion 23 closer to the base end of the arm portion 25 than the suction unit 30d and in the vicinity of the suction unit 30d.

A plurality of regulation pins 50 are formed on the upper surface S of the transfer arm 22. The regulation pin 50 is configured to regulate the displacement of the substrate W held by the substrate holding unit 20. That is, even when the substrate W held by the substrate holding unit 20 is displaced, the substrate W comes into contact with the side surface of the regulation pin 50, so that the substrate W does not move beyond the regulation pin 50. The height position of the upper end of the regulation pin 50 is set to be higher than the support 40. The height position of the upper end of the regulation pin 50 may be, for example, 1.5 times or more of the height of the support 40. The regulation pin 50 may have, for example, a circular columnar shape. The regulation pin 50 may be made of, for example, rubber.

In the examples of FIGS. 3 to 5, two regulation pins 50a and 50b are formed on the upper surface S of the transfer arm 22. The regulation pin 50a is located in a region of the base portion 23 closer to the base end of the base portion 23 (near the moving mechanism 21) than the support 40b. The regulation pin 50b is located in a region of the base portion 23 closer to the base end of the base portion 23 (near the moving mechanism 21) than the support 40d.

A suction flow path F is formed inside the transfer arm 22 to fluidly and physically connect the plurality of suction holes 26. In the examples of FIGS. 4 and 5, the suction flow path F is configured with five flow paths F1 to F5. The flow path F1 connects the suction hole 26a and the suction hole 26b. The flow path F2 connects the suction hole 26c and the suction hole 26d. The flow path F3 extends in the base portion 23 and is fluidly connected to the valve V and the suction pump P. The flow path F4 connects the flow path F1 and the flow path F3. The flow path F5 connects the flow path F2 and the flow path F3.

As illustrated in FIG. 4, the suction flow path F of the transfer arm 22a is connected to a pipe D1. The valve V (hereinafter, referred to as "valve V1") is arranged in the pipe D1. Each suction flow path F of the transfer arms 22b to 22e joins one pipe D2. The valve V (hereinafter, referred to as "valve V2") is arranged in the pipe D2. The pipes D1 and D2 join a pipe D3. The suction pump P is arranged in the pipe D3. Accordingly, when the suction pump P operates based on a signal of the controller Ctr in a state where the valve V1 is open and the valve V2 is closed, a suction force is generated in each suction hole 26 of the transfer arm 22a, but no suction force is generated in each suction hole 26 of the transfer arms 22b to 22e. When the suction pump P operates based on a signal of the controller Ctr in a state where the valve V1 is closed and the valve V2 is open, no suction force is generated in each suction hole 26 of the transfer arm 22a, but a suction force is generated in each suction hole 26 of the transfer arms 22b to 22e. When the suction pump P operates based on a signal of the controller Ctr in a state where the valves V1 and V2 are open, a suction force is generated in each suction hole 26 of the transfer arms 22a to 22e. When the suction pump P operates based on a signal of the controller Ctr in a state where the valves V1 and V2 are closed, no suction force is generated in each suction hole 26 of the transfer arms 22a to 22e.

Figure 7:
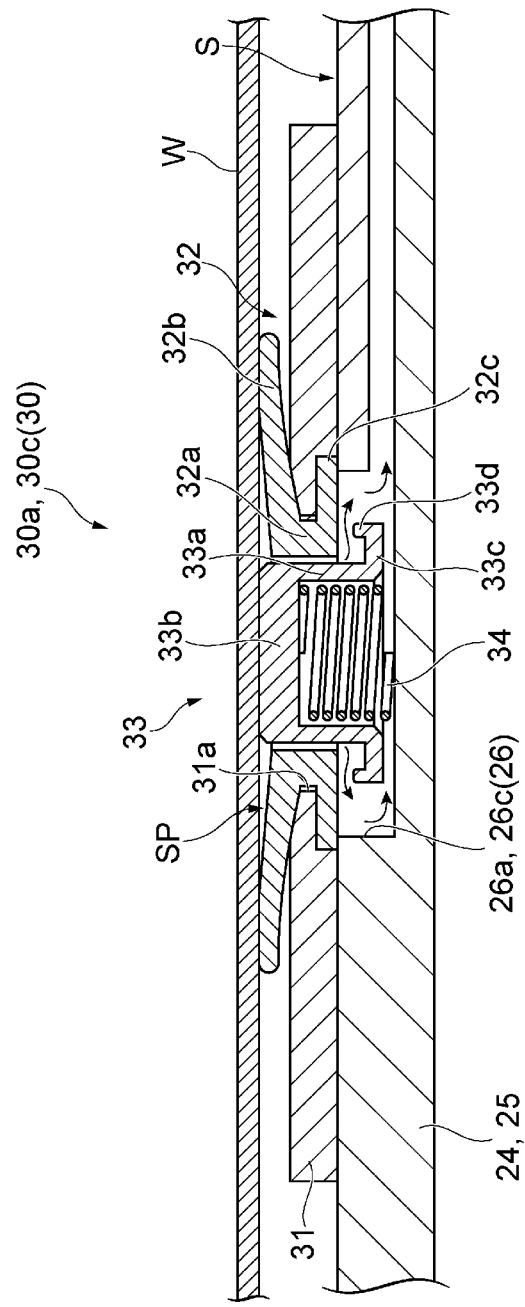
FIG. 7 is a partial cross-sectional view of the transfer arm of FIG. 6 in a state where a substrate is held.

Here, a more detailed configuration of the suction unit 30 will be described with reference to FIGS. 6 and 7. FIG. 6 illustrates the suction units 30a and 30c, but the other suction units 30b and 30d have the same configuration.

The suction unit 30 is disposed in the suction hole 26 so as to cover the suction hole 26. The suction unit 30 includes a fixing member 31, a sealing member 32 (a first sealing member and a second sealing member), a protrusion 33 (a first protrusion and a second protrusion), and an elastic member 34 (a first elastic member and a second elastic member).

The fixing member 31 is configured to fix the suction unit 30 to the upper surface S of the transfer arm 22. The fixing member 31 is a plate-shaped annular member having a through-hole 31a formed in the center thereof. The fixing member 31 is arranged with respect to the suction hole 26 so that the through-hole 31a and the suction hole 26 communicate with each other. The fixing member 31 may have, for example, a circular annular shape. The fixing member 31 is fixed to the transfer arm 22 by a fastener such as a screw (not illustrated).

The sealing member 32 may be configured to be elastically deformable, and may be made of, for example, rubber. The sealing member 32 includes a main body portion 32a, a diameter-enlarged portion 32b, and a flange portion 32c. The main body portion 32a has a cylindrical shape and is inserted through the through-hole 31a. The main body portion 32a may have, for example, a circular cylindrical shape.

The diameter-enlarged portion 32b is connected to the upper end of the main body portion 32a. The diameter-enlarged portion 32b is configured to be enlarged in diameter (be increased in diameter) as it goes upward. That is, the diameter-enlarged portion 32b protrudes upward from the upper surface S of the transfer arm 22. When the substrate W is placed on the suction unit 30, the diameter-enlarged portion 32b is elastically deformed and comes into contact with the back surface of the substrate W (see FIG. 7).

The flange portion 32c has an annular shape, and is connected at the inner peripheral edge thereof to the lower end of the main body portion 32a. The flange portion 32c may have, for example, a circular annular shape. The flange portion 32c extends so as to expand outward in the radial direction of the main body portion 32a, and is caught and fixed by the back surface of the fixing member 31. Specifically, the inner peripheral edge of the fixing member 31 (around the through-hole 31a) is sandwiched between the diameter-enlarged portion 32b and the flange portion 32c, so that the sealing member 32 is attached in the through-hole 31a of the fixing member 31. That is, the sealing member 32 is also disposed corresponding to the suction hole 26 similarly to the fixing member 31.

The protrusion 33 includes a main body portion 33a (a first main body portion and a second main body portion), a ceiling portion 33b, a flange portion 33c (a first flange portion and a second flange portion), and an annular bulge 33d (a first annular bulge and a second annular bulge). The main body portion 33a has a cylindrical shape, and is inserted through the through-hole 31a and the suction hole 26. The main body portion 33a may have, for example, a circular cylindrical shape.

The ceiling portion 33b has a plate shape, and is provided at the upper end of the main body portion 33a so as to close an opening on the upper end side of the main body portion 33a. That is, the main body portion 33a and the ceiling portion 33b define a bottomed cylindrical body.

The flange portion 33c has an annular shape, and is connected at the inner peripheral edge thereof to the lower end of the main body portion 33a. The flange portion 33c may have, for example, a circular annular shape. The flange portion 33c extends so as to expand outward in the radial direction of the main body portion 33a. The outer diameter of the flange portion 33c is set to be larger than the inner diameter of the main body portion 32a of the sealing member 32 and to be smaller than the outer diameter of the flange portion 32c of the sealing member 32.

The annular bulge 33d is provided on the outer peripheral edge of the flange portion 33c, and extends over the entire outer peripheral edge. The annular bulge 33d protrudes upward toward the upper end side (the ceiling portion 33b side) of the main body portion 33a.

The elastic member 34 is disposed in the main body portion 33a. The upper end of the elastic member 34 is in contact with the ceiling portion 33b, and the lower end of the elastic member 34 is in contact with the bottom wall of the suction hole 26 (the suction flow path F). The elastic member 34 is configured to press the protrusion 33 upward.

The elastic member 34 presses the protrusion 33 upward, so that the protrusion 33 protrudes upward from the suction hole 26. More specifically, the elastic member 34 presses the protrusion 33 upward, so that the height position of the upper end of the protrusion 33 is located above the height position of the upper end of the flange portion 32c in a state where no substrate is placed on the protrusion 33 (see FIG. 6).

The elastic member 34 presses the protrusion 33 upward, so that the tip of the annular bulge 33d comes into contact with and is pressed by the lower surface of the flange portion 32c of the sealing member 32 in a state where no substrate is placed on the protrusion 33 (see FIG. 6). Therefore, the suction hole 26 is blocked by the protrusion 33 in a state where no substrate is placed on the protrusion 33.

Meanwhile, in a state where the substrate W is placed on the protrusion 33, the protrusion 33 is pushed downward against the pressing force of the elastic member 34 by the weight of the substrate W and the suction force generated by the suction pump P. At this time, the tip of the annular bulge 33d is spaced apart from the lower surface of the flange portion 32c of the sealing member 32, the suction flow path F communicates with the outside (a space SP surrounded by the back surface of the substrate W and the diameter-enlarged portion 32b) through the suction hole 26, and the space SP is pressure-reduced through a gap between the annular bulge 33d and the flange portion 32c (see the arrow in FIG. 7).

The plurality of detecting units SE may include, for example, detecting units SE1 to SE5 configured to detect whether or not the substrate W is placed on the transfer arms 22a to 22e (see FIG. 4). The detecting units SE1 to SE5 may be arranged, for example, on the lateral side of the transfer arms 22a to 22e, respectively. The plurality of detecting units SE may include, for example, a detecting unit SE6 configured to detect whether or not the substrate W placed on any one of the transfer arms 22 is displaced forward from a predetermined range (see FIG. 3). The detecting unit SE6 may be arranged, for example, in the vicinity of the tip end of the transfer arm 22.

The detecting unit SE is not particularly limited as long as it may detect the presence of the substrate W, but may be, for example, a photoelectric sensor or a camera. The detecting unit SE illustrated in FIGS. 3 and 4 is a photoelectric sensor. The photoelectric sensor may be configured with, for example, a light receiving/emitting device including a light receiving element and a light emitting element that emits light toward the light receiving element. When the substrate W is located between the light receiving element and the light emitting element, the light receiving element cannot receive the light from the light emitting element, and the presence of the substrate W is detected. The detecting unit SE may output a detection signal indicating that the presence of the substrate W was detected to the controller Ctr.

[Method of Transferring Substrate]

A method of delivering and transferring the substrate W using the substrate transfer device A1 configured as described above will be described. Hereinafter, the delivery and transfer of the substrate W by the transfer arm 22a will be described, but the delivery and transfer of the substrate W by the other transfer arms 22b to 22d are the same, and thus the description thereof will be omitted.

First, a method of transferring the substrate W which is not processed in the processing unit 9 from the carrier 7 to the shelf unit 6 by the transfer arm 22a will be described as an example with reference to FIGS. 8A and 8B. First, in a state where the transfer arm 22 is at a retreat position where it is pulled to the base 10 (see FIGS. 3 and 4), the controller Ctr instructs the substrate transfer device A1 to move the substrate transfer device A1 so that the substrate transfer device A1 is located in front of the carrier 7.

Next, in a state where the controller Ctr does not receive a detection signal from the detecting unit SE1 (a state where the substrate W does not exist on the transfer arm 22a), the controller Ctr instructs the moving mechanism 21a to advance the transfer arm 22a forward with respect to the base 10 so that the transfer arm 22a is located at a first advance position (see FIG. 8A). Thus, the transfer arm 22a is inserted into the carrier 7. At this time, when viewed from above, the substrate W overlaps with each of the suction units 30a to 30d and the supports 40b and 40d, but does not overlap with the supports 40a and 40c and the regulation pins 50a and 50b. In this state, the controller Ctr instructs the suction pump P and the valve V1 to operate the suction pump P while opening the valve V1. Thus, a suction force is generated in each suction hole 26 of the transfer arm 22a. Before advancing the the transfer arm 22a forward, it may be confirmed by using, for example, a sensor (not illustrated) that the substrate W does not exist on the transfer arm 22a.

Next, the controller Ctr instructs the moving mechanism 21a to raise the transfer arm 22a. Thus, the substrate W before being processed, supported in the carrier 7 by the plurality of support pieces 7a, is delivered to the transfer arm 22a. Specifically, as illustrated in FIG. 8B, the substrate W before being processed is placed on the suction units 30a and 30c and the supports 40b and 40d. Thus, the substrate W before being processed pushes down the protrusions 33 of the suction units 30a and 30c against the pressing force of the elastic member 34, and the space SP (see FIG. 7) communicates with the suction flow path F to reach a negative pressure. Therefore, the substrate W before being processed is adsorbed in the suction units 30a and 30c through the suction holes 26. The substrate W before being processed is placed on the suction units 30a and 30c and the supports 40b and 40d having different heights, thus being obliquely tilted. Therefore, the substrate W before being processed does not come into contact with the suction units 30b and 30d located in the vicinity of the supports 40b and 40d. That is, since the respective protrusions 33 of the suction units 30b and 30d are not pushed down, no evacuation occurs in the suction units 30b and 30d.

Next, the controller Ctr instructs the moving mechanism 21a to move the transfer arm 22 to the retreat position. Next, in a state where the controller Ctr does not receive a detection signal from the detecting unit SE6 (a state where the substrate W on the transfer arm 22a is not displaced forward from the predetermined range), the controller Ctr instructs the substrate transfer device A1 to move the substrate transfer device A1 so that the substrate transfer device A1 is located in front of the shelf unit 6.

Next, in a state where the controller Ctr receives a detection signal from the detecting unit SE1 (a state where the substrate W exists on the transfer arm 22a), the controller Ctr instructs the moving mechanism 21a to advance the transfer arm 22a forward with respect to the base 10 so that the transfer arm 22a is located at the first advance position. Thus, the transfer arm 22a is inserted into the shelf unit 6.

Next, the controller Ctr instructs the suction pump P and the valve V1 to stop the suction pump P while closing the valve V1. Thus, the suction force disappears in each suction hole 26 of the transfer arm 22a. In this state, the controller Ctr instructs the moving mechanism 21a to lower the transfer arm 22a. Thus, the substrate W before being processed, placed on the transfer arm 22a, is delivered to the support pieces 6a of the shelf unit 6. Thereafter, the controller Ctr instructs the moving mechanism 21a to move the transfer arm 22 to the retreat position. In this way, the substrate W before being processed is transferred from the carrier 7 to the shelf unit 6. When the transfer arm 22 moves to the retreat position, the controller Ctr may instruct the suction pump P and the valve V1 to operate the suction pump P while opening the valve V1, thereby generating a suction force in each suction hole 26 of the transfer arm 22a. In this case, even if the substrate W before being processed remains on the transfer arm 22a, it is possible to suppress the substrate W before being processed from falling from the transfer arm 22a since the substrate W before being processed is adsorbed in the suction units 30a and 30c through the suction holes 26.

Subsequently, a method of transferring the substrate W which is processed in the processing unit 9 from the shelf unit 6 to the carrier 7 by the transfer arm 22a will be described as an example with reference to FIGS. 9A and 9B. First, in a state where the transfer arm 22 is at the retreat position where it is pulled to the base 10 (see FIGS. 3 and 4), the controller Ctr instructs the substrate transfer device A1 to move the substrate transfer device A1 so that the substrate transfer device A1 is located in front of the shelf unit 6.

Next, in a state where the controller Ctr does not receive a detection signal from the detecting unit SE1 (a state where the substrate W does not exist on the transfer arm 22a), the controller Ctr instructs the moving mechanism 21a to advance the transfer arm 22a forward with respect to the base 10 so that the transfer arm 22a is located at a second advance position different from the first advance position (see FIG. 9A). Thus, the transfer arm 22a is inserted into the shelf unit 6. At this time, when viewed from above, the substrate W overlaps with each of the suction units 30a to 30d and the supports 40a and 40c, but does not overlap with the supports 40b and 40d and the regulation pins 50a and 50b. In this state, the controller Ctr instructs the suction pump P and the valve V1 to operate the suction pump P while opening the valve V1. Thus, a suction force is generated in each suction hole 26 of the transfer arm 22a. Before advancing the the transfer arm 22a forward, it may be confirmed by using, for example, a sensor (not illustrated) that the substrate W does not exist on the transfer arm 22a.

Next, the controller Ctr instructs the moving mechanism 21a to raise the transfer arm 22a. Thus, the substrate W after being processed, supported in the shelf unit 6 by the plurality of support pieces 6a, is delivered to the transfer arm 22a. Specifically, as illustrated in FIG. 9B, the substrate W after being processed is placed on the suction units 30b and 30d and the supports 40a and 40c. Thus, the substrate W after being processed pushes down the protrusions 33 of the suction units 30b and 30d against the pressing force of the elastic member 34, and the space SP (see FIG. 7) communicates with the suction flow path F to reach a negative pressure. Therefore, the substrate W after being processed is adsorbed in the suction units 30b and 30d through the suction holes 26. The substrate W after being processed is placed on the suction units 30b and 30d and the supports 40a and 40c having different heights, thus being obliquely tilted. Therefore, the substrate W after being processed does not come into contact with the suction units 30a and 30c located in the vicinity of the supports 40a and 40c. That is, since the respective protrusions 33 of the suction units 30a and 30c are not pushed down, no evacuation occurs in the suction units 30a and 30c.

Next, the controller Ctr instructs the moving mechanism 21a to move the transfer arm 22 to the retreat position. Next, in a state where the controller Ctr does not receive a detection signal from the detecting unit SE6 (a state where the substrate W on the transfer arm 22a is not displaced forward from the predetermined range), the controller Ctr instructs the substrate transfer device A1 to move the substrate transfer device A1 so that the substrate transfer device A1 is located in front of the carrier 7.

Next, in a state where the controller Ctr receives a detection signal from the detecting unit SE1 (a state where the substrate W exists on the transfer arm 22a), the controller Ctr instructs the moving mechanism 21a to advance the transfer arm 22a forward with respect to the base 10 so that the transfer arm 22a is located at the second advance position. Thus, the transfer arm 22a is inserted into the carrier 7.

Next, the controller Ctr instructs the suction pump P and the valve V1 to stop the suction pump P while closing the valve V1. Thus, the suction force disappears in each suction hole 26 of the transfer arm 22a. In this state, the controller Ctr instructs the moving mechanism 21a to lower the transfer arm 22a. Thus, the substrate W after being processed, placed on the transfer arm 22a, is delivered to the support pieces 7a of the carrier 7. Thereafter, the controller Ctr instructs the moving mechanism 21a to move the transfer arm 22 to the retreat position. In this way, the substrate W after being processed is transferred from the shelf unit 6 to the carrier 7. When the transfer arm 22 moves to the retreat position, the controller Ctr may instruct the suction pump P and the valve V1 to operate the suction pump P while opening the valve V1, thereby generating a suction force in each suction hole 26 of the transfer arm 22a. In this case, even if the substrate W after being processed remains on the transfer arm 22a, it is possible to suppress the substrate W after being processed from falling from the transfer arm 22a since the substrate W after being processed is adsorbed in the suction units 30a and 30c through the suction holes 26.

[Actions]

According to the above examples, the substrate W is held by the substrate holding unit 20 (the transfer arm 22) by adsorbing the substrate W through the suction hole 26. Therefore, the substrate W is more reliably held with respect to the substrate holding unit 20 as compared with a case where the substrate W is simply placed on support pins. Accordingly, it is possible to suppress the displacement of the substrate W with respect to the substrate holding unit 20. In addition, since the substrate W may be more reliably held, a high movement speed of the substrate holding unit 20 may be set upon the transfer of the substrate W. Therefore, it is possible to improve productivity.

According to the above examples, the substrate W before being processed is held by the suction units 30a and 30c and the supports 40b and 40d. In this case, since the protrusion 33 pressed upward by the elastic member 34 blocks each suction hole 26 in the suction units 30b and 30d, evacuation in each suction hole 26 is suppressed. Therefore, the adsorption force of the substrate W through each suction hole 26 in the suction units 30a and 30c is increased. Meanwhile, the substrate W after being processed is held by the suction units 30b and 30d and the supports 40a and 40c. In this case, since the protrusion 33 pressed upward by the elastic member 34 blocks each suction hole 26 in the suction units 30a and 30c, evacuation in each suction hole 26 is suppressed. Therefore, the adsorption force of the substrate W through each suction hole 26 in the suction units 30b and 30d is increased. Moreover, the suction units 30a and 30c (the protrusions 33) and the supports 40b and 40d which come into contact with the substrate W before being processed and the suction units 30b and 30d (the protrusions 33) and the supports 40a and 40c which come into contact with the substrate W after being processed are cut. That is, the respective protrusions 33 of the suction units 30a and 30c and the supports 40b and 40d, contaminated by coming into contact with the substrate W before being processed, do not come into contact with the substrate W after being processed. Accordingly, it is possible to increase the adsorption force of the substrate W before and after being processed while maintaining the cleanliness of the substrate W after being processed.

According to the above examples, the height position of the upper end of the support 40 may be set to be higher than the height position of the upper end of the protrusion 33 of the suction unit 30. In this case, it is difficult for the substrate W held by the suction units 30a and 30c and the supports 40b and 40d to come into contact with the suction units 30b and 30d. Similarly, it is difficult for the substrate W held by the suction units 30b and 30d and the supports 40a and 40c to come into contact with the suction units 30a and 30c. Therefore, it is possible to more reliably maintain the cleanliness of the substrate W.

With the above examples, according to the advance position of the substrate holding unit 20 (the transfer arm 22) from the base 10, it is determined whether the substrate W will be supported by the suction units 30a and 30c and the supports 40b and 40d or by the suction units 30b and 30d and the supports 40a and 40c. Therefore, by a simple method of controlling the position of the substrate holding unit 20 (the transfer arm 22), it is possible to determine whether to support the substrate W by the suction units 30a and 30c and the supports 40b and 40d or by the suction units 30b and 30d and the supports 40a and 40c.

According to the above examples, since the sealing member 32 comes into contact with the back surface of the substrate W in the state where the substrate W is placed on the protrusion 33, the space SP surrounded by the back surface of the substrate W and the diameter-enlarged portion 32b is pressure-reduced through the suction hole 26 according to an operation of the suction pump P. Moreover, since the sealing member 32 is elastically deformable, evacuation is suppressed by deformation depending on the posture of the substrate W, so that the pressure reduction in the space SP is effectively performed. Therefore, it is possible to further increase the adsorption force of the substrate W through the suction hole 26.

According to the above examples, when the protrusion 33 is pressed upward by the elastic member 34, the flange portion 33c engages with the lower surface of the flange portion 32c of the sealing member 32. That is, the flange portion 32c functions as a stopper that suppress the protrusion 33 from escaping from the sealing member 32, and functions as a seal member that more reliably blocks the suction hole 26. Accordingly, since unintentional evacuation from the suction hole 26 is further suppressed, it is possible to further increase the adsorption force of the substrate W through the suction hole 26.

According to the above examples, when the protrusion 33 is pressed upward by the elastic member 34, the upper end of the annular bulge 33d comes into contact with and is pressed by the lower surface of the flange portion 32c of the sealing member 32. Therefore, since the contact area of the annular bulge 33d and the lower surface of the flange portion 32c is relatively small, a greater pressure is applied from the annular bulge 33d to the flange portion 32c. Accordingly, the annular bulge 33d functions as a seal member which more reliably blocks the suction hole 26. As a result, since unintentional evacuation from the suction hole 26 is further suppressed, it it possible to further increase the adsorption force of the substrate W through the suction hole 26.

According to the above examples, the substrate holding unit 20 includes the plurality of transfer arms 22a to 22e. Therefore, it is possible to hold and transfer a plurality of substrates W simultaneously by one substrate holding unit 20.

Modifications

The disclosure of this specification should be considered as exemplary and not restrictive in all terms. Various omissions, substitutions, changes, and others may be made with respect to the above examples within the range not departing from the claims and the gist thereof.

Figure 10:
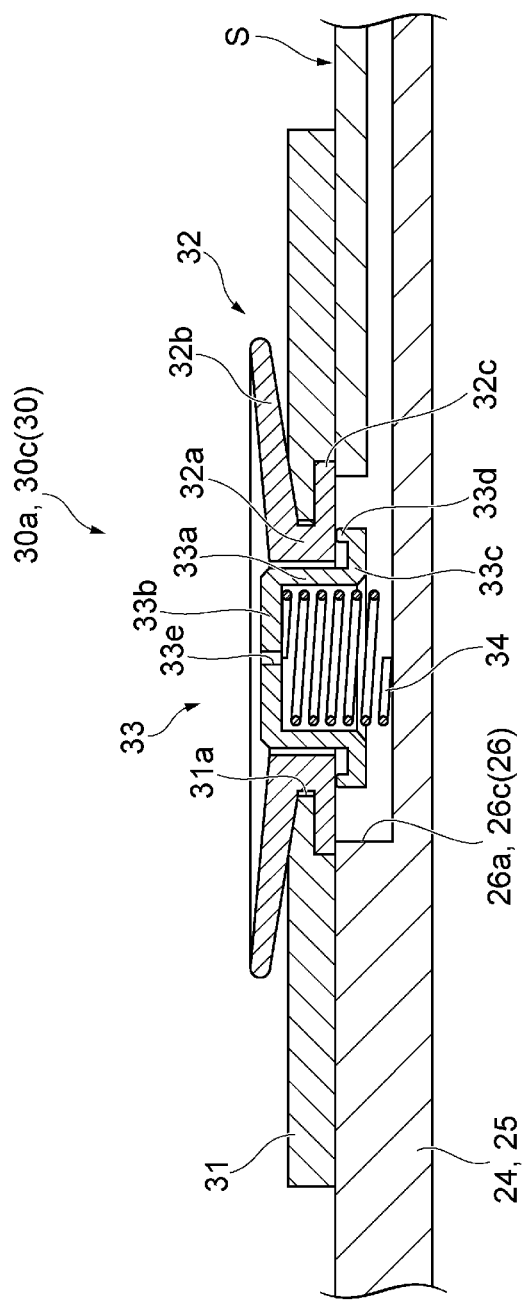
FIG. 10 is a cross-sectional view partially illustrating another example of a transfer arm.
Figure 11:
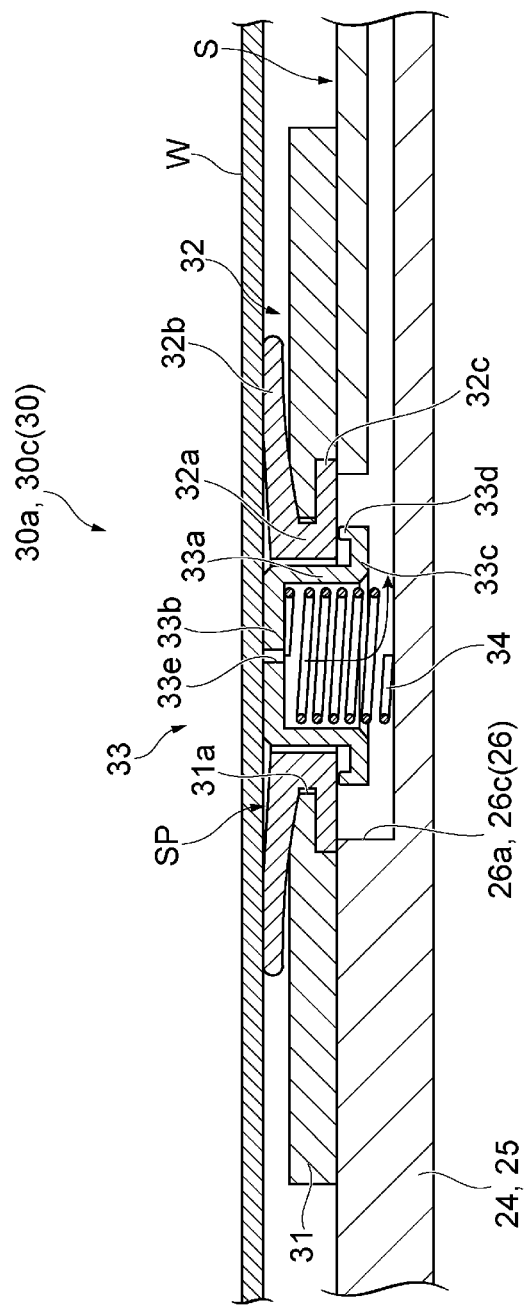
FIG. 11 is a partial cross-sectional view of the transfer arm of FIG. 10 in a state where a substrate is held.

(1) As illustrated in FIG. 10, a small hole 33e (a first small hole and a second small hole) may be provided in the protrusions 33. The small hole 33e may be formed so as to penetrate, for example, the ceiling portion 33b. Further, the elastic member 34 presses the protrusion 33 upward, so that the height position of the upper end of the protrusion 33 may be located below the height position of the upper end of the flange portion 32c in a state where no substrate is placed on the protrusion 33. In this case, when the substrate W is placed on the protrusion 33 and the suction pump P operates, the diameter-enlarged portion 32b is elastically deformed by the weight of the substrate W and comes into contact with the back surface of the substrate W, so that the space SP surrounded by the back surface of the substrate W and the diameter-enlarged portion 32b is pressure-reduced through the small hole 33e (see the arrow in FIG. 11). Therefore, since the suction force hardly acts on the protrusion 33, the protrusion 33 hardly or at all moves downward by the pressing force of the elastic member 34.

In the example of FIG. 10, for example, when receiving the substrate W at the first advance position, the substrate W is placed on the suction units 30a and 30c and the supports 40b and 40d, but does not come into contact with the suction units 30b and 30d. At this time, since the small hole 33e is formed in each protrusion 33 of the suction units 30b and 30d, slight evacuation occurs, but does not have an effect enough to significantly deteriorate the suction force of the substrate W in the suction units 30a and 30c. Therefore, the same effect as the above-described examples is also obtained in the example of FIG. 10.

In the example of FIG. 10, for example, when delivering the substrate W at the first advance position, the pressure naturally escapes from the small hole 33e of each protrusion 33 of the suction units 30b and 30d to the suction flow path F when the suction pump P is stopped. Therefore, the pressure in the space SP surrounded by the back surface of the substrate W and the diameter-enlarged portion 32b naturally approaches the atmospheric pressure. Accordingly, it is possible to easily take out the substrate W from the substrate holding unit 20 after the adsorption of the substrate W is stopped.

The diameter of the small hole 33e may be, for example, about 0.3 mm to 0.5 mm. When the diameter of the small hole 33e is 0.3 mm or more, impurities are less likely to be accumulated in the small hole 33e. When the diameter of the small hole 33e is 0.5 mm or less, since the effect of evacuation occurring in the small hole 33e becomes less, it is possible to more reliably adsorb the substrate W through the suction hole 26.

Figure 12:
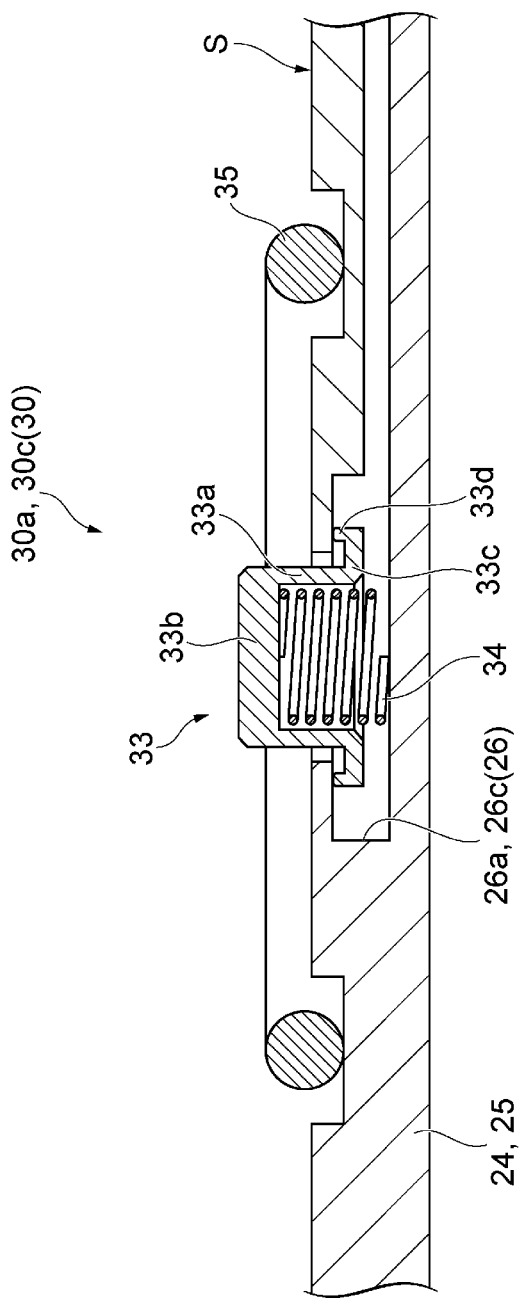
FIG. 12 is a cross-sectional view partially illustrating another example of a transfer arm.

(2) As illustrated in FIG. 12, the suction unit 30 may include a sealing member 35 instead of the fixing member 31 and the sealing member 32. The sealing member 35 is an annular member configured to be elastically deformable. The sealing member 35 may be made of rubber. The sealing member 35 may be, for example, an O-ring. The sealing member 35 may be directly attached to the upper surface S of the transfer arm 22. Further, the diameter of the suction hole 26 may be set to be larger than the outer diameter of the main body portion 33a and be smaller than the outer diameter of the flange portion 33c. In this case, the elastic member 34 presses the protrusion 33 upward, so that the tip of the annular bulge 33d comes into contact with and is pressed by the lower surface of the periphery of the suction hole 26 in a state where no substrate is placed on the protrusion 33.

Figure 13:
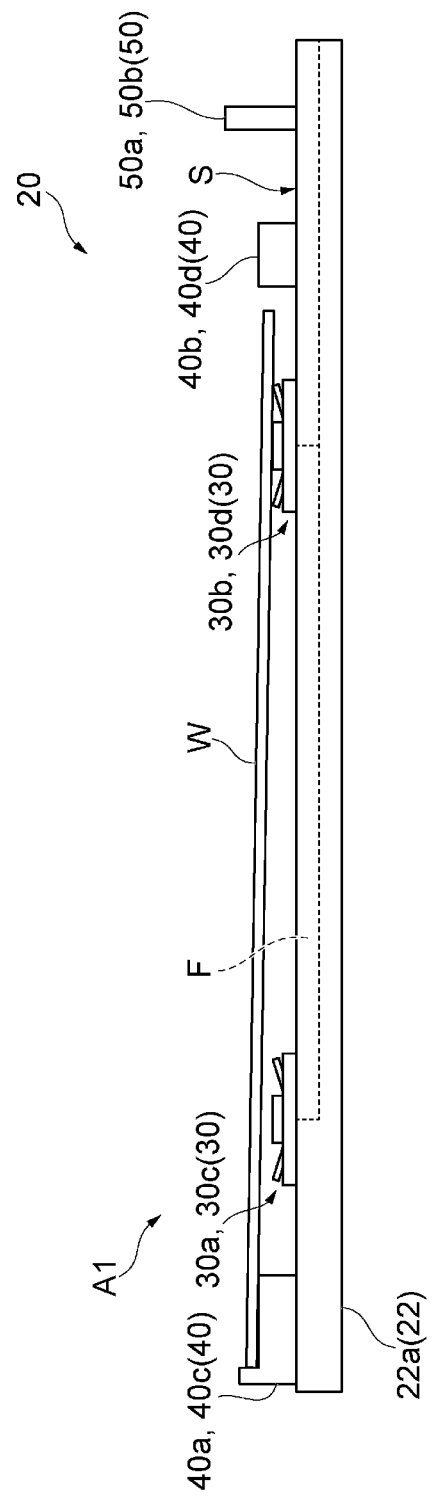
FIG. 13 is a side view illustrating another example of a transfer arm.

(3) Additional regulation pins may be provided on the upper surface S of the transfer arm 22. Specifically, the regulation pins may be provided in a region of the arm portion 24 closer to the tip end thereof than the support 40a and in a region of the arm portion 25 closer to the tip end thereof than the support 40c, respectively. These additional regulation pins may be configured separately from the support 40. Alternatively, as illustrated in FIG. 13, the regulation pins may be provided integrally with the supports 40a and 40c. In this case, the additional regulation pins may be provided on the tip side of the supports 40a and 40c so as to protrude upward from the supports 40a and 40c.

Figure 14:
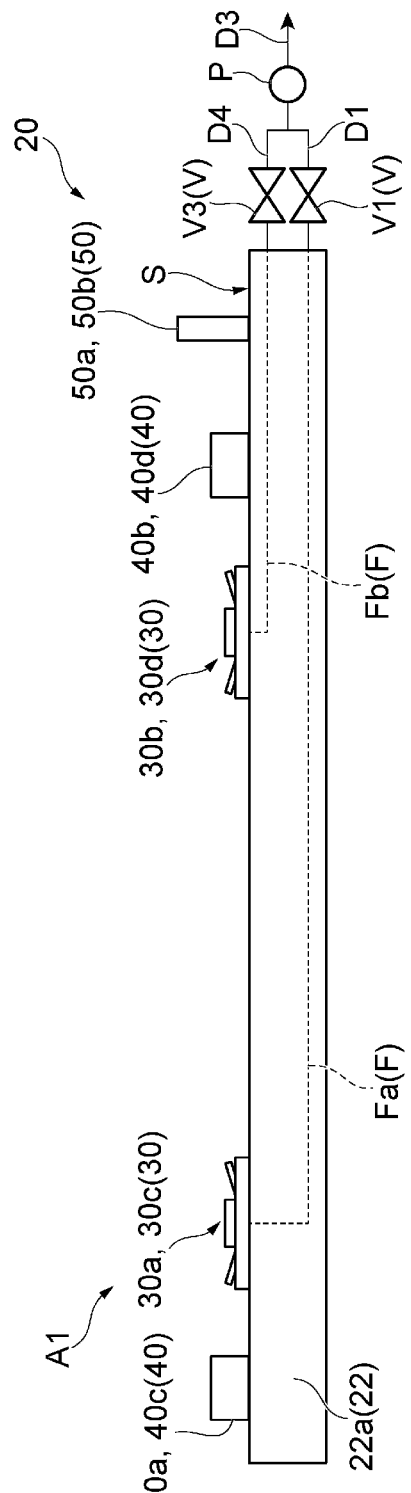
FIG. 14 is a side view illustrating another example of a transfer arm.

(4) As illustrated in FIG. 14, a suction flow path Fa connected to each suction hole 26 of the suction units 30a and 30c and a suction flow path Fb connected to each suction hole 26 of the suction units 30b and 30d may be independent of each other. The suction flow path Fa may be connected to the pipe D1, and the valve V1 may be arranged in the pipe D1. The suction flow path Fb may be connected to a pipe D4, and a valve V3 may be arranged in the pipe D4. In this case, the generation of a suction force in the suction units 30a and 30c and the generation of a suction force in the suction units 30b and 30d may be controlled independently. Therefore, since evacuation in the suction unit 30 on which the substrate W is not placed is further suppressed, it is possible to further increase the adsorption force of the substrate W through the suction hole 26.

(5) Although not illustrated, the suction unit 30 may be tilted with respect to the transfer arm 22 while maintaining airtightness by interposing an elastically deformable member (e.g., an O-ring) between the suction unit 30 and the transfer arm 22. In this case, when adsorbing the substrate W in an oblique posture by the suction unit 30, the suction unit 30 is tilted according to the angle of the substrate W, so that it is possible to further increase the adsorption force of the substrate W through the suction hole 26.

OTHER EXAMPLES

Example 1. An example of a substrate transfer device includes a substrate holding unit configured to hold a substrate and a base to which the substrate holding unit is horizontally movably attached. The substrate holding unit includes a placing surface that faces a back surface of the substrate in a state where the substrate is held, a first suction hole and a second suction hole provided to be open in the placing surface, a suction flow path connected to the first suction hole and the second suction hole, a first protrusion disposed in the first suction hole, a second protrusion disposed in the second suction hole, a first support provided in a vicinity of the first suction hole so as to protrude upward from the placing surface, and a second support provided in a vicinity of the second suction hole so as to protrude upward from the placing surface. The first protrusion is pressed upward by a first elastic member to protrude upward from the first suction hole such that the first protrusion is configured to block the first suction hole in a state where the substrate is not held. The second protrusion is pressed upward by a second elastic member to protrude upward from the second suction hole such that the second protrusion is configured to block the second suction hole in a state where the substrate is not held. In this case, the substrate is suctioned through the first or second suction hole, so that the substrate is held in the substrate holding unit. Therefore, the substrate is more reliably held with respect to the substrate holding unit as compared with a case where the substrate is simply placed on support pins. Accordingly, it is possible to suppress the displacement of the substrate with respect to the substrate holding unit. Further, since the substrate may be more reliably held, a high movement speed of the substrate holding unit may be set upon the transfer of the substrate. Therefore, it is possible to improve productivity. Further, according to the device of Example 1, for example, the substrate before being processed may be held by the first protrusion and the second support, and the substrate after being processed may be held by the second protrusion and the first support. When the substrate before being processed is held by the first protrusion and the second support, since the second protrusion pressed upward by the second elastic member blocks the second suction hole, evacuation in the second suction hole is suppressed. Therefore, the adsorption force of the substrate through the first suction hole is increased. Meanwhile, when the substrate after being processed is held by the second protrusion and the first support, since the first protrusion pressed upward by the first elastic member blocks the first suction hole, evacuation in the first suction hole is suppressed. Therefore, the adsorption force of the substrate through the second suction hole is increased. Moreover, the protrusion and the support which come into contact with the substrate before being processed and the protrusion and the support which come into contact with the substrate after being processed are cut. That is, the first protrusion and the second support contaminated by coming into contact with the substrate before being processed do not come into contact with the substrate after being processed. Accordingly, it is possible to increase the adsorption force of the substrate before and after being processed while maintaining the cleanliness of the substrate after being processed.

Example 2. In the device according to Example 1, an upper end of each of the first support and the second support may be positioned higher than an upper end of each of the first protrusion and the second protrusion. In this case, for example, when the substrate is held by the first protrusion and the second support, it is difficult for the substrate to come into contact with the second protrusion. Similarly, when the substrate is held by the second protrusion and the first support, it is difficult for the substrate to come into contact with the first protrusion. Therefore, it is possible to more reliably maintain the cleanliness of the substrate.

Example 3. The device according to Example 1 or Example 2 further includes a control unit, and the control unit may be configured to move the substrate holding unit with respect to the base among a retreat position where the substrate holding unit is pulled to the base, a first advance position where the substrate holding unit advances from the base to deliver the substrate while the substrate is suctioned in the first suction hole and supported by the second support, and a second advance position where the substrate holding unit advances from the base to deliver the substrate while the substrate is suctioned in the second suction hole and supported by the first support. In this case, according to the advance position of the substrate holding unit from the base, it is determined whether the substrate will be supported by the first protrusion and the second support or by the second protrusion and the first support. Therefore, by a simple method of controlling the position of the substrate holding unit, it is possible to determine whether to support the substrate by the first protrusion and the second support or by the second protrusion and the first support.

Example 4. In the device according to any one of Examples 1 to 3, the substrate holding unit may further include a first elastically deformable annular sealing member disposed corresponding to the first suction hole and protruding upward from the placing surface and a second elastically deformable annular sealing member disposed corresponding to the second suction hole and protruding upward from the placing surface. In this case, the first or second sealing member comes into contact with the back surface of the substrate, so that the space surrounded by the back surface of the substrate and the first or second sealing member is pressure-reduced through the first or second suction hole. Moreover, since the first and second sealing members are elastically deformable, evacuation is suppressed by deformation depending on the posture of substrate, so that the pressure reduction in the space is effectively performed. Therefore, it is possible to further increase the adsorption force of the substrate through the first or second suction hole.

Example 5. Another example of a substrate transfer device includes a substrate holding unit configured to hold a substrate and a base to which the substrate holding unit is horizontally movably attached. The substrate holding unit includes a placing surface that faces a back surface of the substrate in a state where the substrate is held, a first suction hole and a second suction hole provided to be open in the placing surface, a suction flow path connected to the first suction hole and the second suction hole, a first protrusion disposed in the first suction hole, a second protrusion disposed in the second suction hole, a first elastically deformable sealing member disposed in the first suction hole and provided to protrude from the placing surface, and a second elastically deformable sealing member disposed in the second suction hole and provided to protrude from the disposition surface. The first protrusion is pressed upward by a first elastic member to protrude upward from the first suction hole such that the first protrusion is configured to block the first suction hole in a state where the substrate is not held while by being. The second protrusion is pressed upward by a second elastic member to protrude upward from the second suction hole such that the second protrusion is configured to block the second suction hole in a state where the substrate is not held. In this case, the substrate is suctioned through the first or second suction hole, so that the substrate is held in the substrate holding unit. Therefore, the substrate is more reliably held with respect to the substrate holding unit as compared with a case where the substrate is simply placed on support pins. Accordingly, it is possible to suppress the displacement of the substrate with respect to the substrate holding unit. Further, since the substrate may be more reliably held, a high movement speed of the substrate holding unit may be set upon the transfer of the substrate. Therefore, it is possible to improve productivity. Furthermore, according to the device of Example 5, the first or second sealing member comes into contact with the back surface of the substrate, so that the space surrounded by the back surface of the substrate and the first or second sealing member is pressure-reduced through the first or second suction hole. Moreover, since the first and second sealing members are elastically deformable, evacuation is suppressed by deformation depending on the posture of substrate, so that the pressure reduction in the space is effectively performed. Therefore, it is possible to further increase the adsorption force of the substrate through the first or second suction hole.

Example 6. The device according to Example 5 further includes a control unit, and the control unit may be configured to move the substrate holding unit with respect to the base among a retreat position where the substrate holding unit is pulled to the base, a first advance position where the substrate holding unit advances from the base to deliver the substrate while the substrate is suctioned in the first suction hole and not suctioned in the second suction hole, and a second advance position where the substrate holding unit advances from the base to deliver the substrate while the substrate is suctioned in the second suction hole and not suctioned in the first suction hole. In this case, according to the advance position of the substrate holding unit from the base, it is determined whether the substrate will be supported by the first suction hole or by the second suction hole. Therefore, by a simple method of controlling the position of the substrate holding unit, it is possible to determine whether to support the substrate by the first suction hole or by the second suction hole.

Example 7. In the device according to any one of Examples 4 to 6, the first protrusion may include a first columnar main body portion inserted through the first suction hole and the first sealing member and a first flange portion provided at a lower end of the first main body portion so as to expand outward in a radial direction of the first main body portion and having an outer diameter greater than an inner diameter of the first sealing member, and the second protrusion may include a second columnar main body portion inserted through the second suction hole and the second sealing member and a second flange portion provided at a lower end of the second main body portion to expand outward in a radial direction of the second main body portion and having an outer diameter greater than an inner diameter of the second sealing member. In this case, when the first protrusion is pressed upward by the first elastic member, the first flange portion engages with the first sealing member. That is, the first flange portion functions as a stopper that suppress the first protrusion from escaping from the first sealing member, and functions as a seal member that more reliably blocks the first suction hole. The second flange portion also functions in the same way. Accordingly, since unintentional evacuation from the first and second suction holes is more suppressed, it is possible to further increase the adsorption force of the substrate through the first or second suction hole.

Example 8. In the device according to Example 7, a first annular bulge may be provided on an outer peripheral edge of the first flange portion to protrude toward an upper end side of the first main body portion, an upper end of the first annular bulge may be in contact with a lower surface of the first sealing member in a state where the substrate is not held, a second annular bulge may be provided on an outer peripheral edge of the second flange portion to protrude toward an upper end side of the second main body portion, and an upper end of the second annular bulge may be in contact with a lower surface of the second sealing member in a state where the substrate is not held. In this case, the contact area of the first annular bulge and the lower surface of the first sealing member is reduced as compared with a case where the first flange portion is not provided with the first annular bulge and the second flange portion comes into contact with the lower surface of the first sealing member. Therefore, the first annular bulge comes into contact with the lower surface of the first sealing member with a greater pressure. Accordingly, the first annular bulge functions as a seal member that more reliably blocks the first suction hole. The second annular bulge also functions in the same way. As a result, since unintentional evacuation from the first and second suction holes is more suppressed, it is possible to further increase the adsorption force of the substrate through the first or second suction hole.

Example 9. In the device according to any one of Examples 1 to 8, the substrate holding unit may be configured to hold a plurality of substrates simultaneously. In this case, it is possible to transfer a plurality of substrates simultaneously by one substrate holding unit.

Example 10. In the device according to any one of Examples 1 to 9, the first protrusion may be provided with a first small hole that fluidly connects the suction flow path and an outside, and the second protrusion may be provided with a second small hole that fluidly connects the suction flow path and the outside. In this case, when the adsorption of the substrate through the first and second suction holes is stopped, a negative pressure generated in the space between the substrate and the first or second suction hole naturally escapes from the first or second small hole. Therefore, it is possible to easily take out the substrate from the substrate holding unit after the adsorption of the substrate is stopped.

Example 11. An example of a substrate transfer method is a method of transferring a substrate using the device according to any one of Examples 1 to 10, the method including first advancing the substrate holding unit with respect to the base such that the substrate holding unit is located at the first advance position; after the first advancing, first receiving the substrate at the first advance position such that the substrate is suctioned in the first suction hole and is not suctioned in the second suction hole; after the first receiving, transferring the substrate to a processing unit to process the substrate in the processing unit; after the transferring, second advancing the substrate holding unit with respect to the base such that the substrate holding unit is located at the second advance position; and after the second advancing, second receiving the processed substrate at the second advance position such that the substrate is suctioned in the second suction hole and is not suctioned in the first suction hole. In this case, the same operational effects as those of Example 1 or Example 5 are obtained. Further, in this case, according to the advance position of the substrate holding unit from the base, it is determined whether the substrate will be supported by the first suction hole or by the second suction hole. Therefore, by a simple method of controlling the position of the substrate holding unit, it is possible to determine whether to support the substrate by the first suction hole or by the second suction hole.

With a substrate transfer device and a substrate transfer method according to the present disclosure, it is possible to more reliably hold a substrate and suppress the displacement of the substrate.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A substrate transfer device comprising:
 a substrate holder configured to hold a substrate; and
 a base to which the substrate holder is attached to be movable in a horizontal direction,
 wherein the substrate holder includes:
  a placing surface that faces a back surface of the substrate in a state where the substrate is held on the substrate holder;
  a first suction hole and a second suction hole provided to be open in the placing surface;
  a suction flow path connected to the first suction hole and the second suction hole;
  a first protrusion disposed in the first suction hole;
  a second protrusion disposed in the second suction hole;
  a first support provided in a vicinity of the first suction hole and having a different height from the first protrusion and the second protrusion; and a second support provided in a vicinity of the second suction hole and having a different height from the first protrusion and the second protrusion, wherein the first protrusion is pressed by a first elastic member toward an upward direction to protrude from the first suction hole toward the upward direction such that the first protrusion is configured to block the first suction hole in a state where the substrate is not held, wherein the second protrusion is pressed by a second elastic member toward the upward direction to protrude from the second suction hole toward the upward direction such that the second protrusion is configured to block the second suction hole in a state where the substrate is not held, and wherein the substrate holder holds the substrate either on both the first protrusion and the second support or on both the second protrusion and the first support such that the substrate is obliquely tilted.

2. The substrate transfer device according to claim 1, further comprising a controller, wherein the controller is configured to move the substrate holder with respect to the base among a retreat position, a first advance position, and a second advance position, wherein the retreat position is a position where the substrate holder is pulled to the base;

the first advance position is a position where the substrate holder advances from the base to deliver the substrate, while the substrate is suctioned in the first suction hole and not suctioned in the second suction hole; and the second advance position is a position where the substrate holder advances from the base to deliver the substrate, while the substrate is suctioned in the second suction hole and not suctioned in the first suction hole.

3. The substrate transfer device according to claim 2, wherein the controller is configured to:

first advance the substrate holder with respect to the base such that the substrate holder is located at the first advance position;

after the first advance, first receive the substrate at the first advance position such that the substrate is suctioned in the first suction hole and is not suctioned in the second suction hole;

after the first receive, transfer the substrate to a processing container to process the substrate in the processing container;

after the transfer, second advance the substrate holder with respect to the base such that the substrate holder is located at the second advance position; and after the second advance, second receive the processed substrate at the second advance position such that the substrate is suctioned in the second suction hole and is not suctioned in the first suction hole.

4. The substrate transfer device according to claim 1, wherein the first support and the second support protrude upward from the placing surface.

5. The substrate transfer device according to claim 4, wherein an upper end of each of the first support and the second support is positioned higher than an upper end of each of the first protrusion and the second protrusion.

6. The substrate transfer device according to claim 4, further comprising a controller, wherein the controller is configured to move the substrate holder with respect to the base among a retreat position, a first advance position, and a second advance position, wherein the retreat position is a position where the substrate holder is pulled to the base;

the first advance position is a position where the substrate holder advances from the base to deliver the substrate, while the substrate is suctioned in the first suction hole and supported by the second support; and the second advance position is a position where the substrate holder advances from the base to deliver the substrate, while the substrate is suctioned in the second suction hole and supported by the first support.

7. The substrate transfer device according to claim 6, wherein the controller is configured to:

first advance the substrate holder with respect to the base such that the substrate holder is located at the first advance position;

after the first advance, first receive the substrate at the first advance position such that the substrate is suctioned in the first suction hole and is not suctioned in the second suction hole;

after the first receive, transfer the substrate to a processing container to process the substrate in the processing container;

after the transfer, second advance the substrate holder with respect to the base such that the substrate holder is located at the second advance position; and after the second advance, second receive the processed substrate at the second advance position such that the substrate is suctioned in the second suction hole and is not suctioned in the first suction hole.

8. The substrate transfer device according to claim 1, wherein the substrate holder further includes:

a first seal having an annular shape that is elastically deformable, disposed corresponding to the first suction hole, and protruding upward from the placing surface; and a second seal having an annular shape that is elastically deformable, disposed corresponding to the second suction hole, and protruding upward from the placing surface.

9. The substrate transfer device according to claim 8, wherein the first protrusion includes:

a first main body portion having a columnar shape and inserted through the first suction hole and the first seal; and a first flange portion provided at a lower end of the first main body portion to expand outward in a radial direction of the first main body portion and having an outer diameter greater than an inner diameter of the first seal, and wherein the second protrusion includes:

a second main body portion having a columnar shape and inserted through the second suction hole and the second seal; and a second flange portion provided at a lower end of the second main body portion to expand outward in a radial direction of the second main body portion and having an outer diameter greater than an inner diameter of the second seal.

10. The substrate transfer device according to claim 9, wherein a first annular bulge is provided on an outer peripheral edge of the first flange portion to protrude toward an upper end side of the first main body portion, an upper end of the first annular bulge is in contact with a lower surface of the first seal in a state where the substrate is not held, a second annular bulge is provided on an outer peripheral edge of the second flange portion to protrude toward an upper end side of the second main body portion, and an upper end of the second annular bulge is in contact with a lower surface of the second seal in a state where the substrate is not held.

11. The substrate transfer device according to claim 1, wherein the substrate holder is configured to hold a plurality of substrates simultaneously.

12. The substrate transfer device according to claim 1, wherein the first protrusion is provided with a first hole that fluidly connects the suction flow path and an outside; and wherein the second protrusion is provided with a second hole that fluidly connects the suction flow path and the outside.

13. A method of transferring a substrate comprising:

providing a substrate transfer device including a substrate holder that accommodates a substrate and a base to which the substrate holder is movably attached to be movable in a horizontal direction, the substrate holder including a placing surface that faces a back surface of the substrate when the substrate is held on the substrate holder and being provided with a first suction hole and a second suction hole to be open in the placing surface;

first advancing the substrate holder with respect to the base such that the substrate holder is located at a first advancing position where the substrate holder advances from the base to deliver the substrate while the substrate is suctioned in the first suction hole and not suctioned in the second suction hole;

after the first advancing, first receiving the substrate at the first advance position such that the substrate is suctioned in the first suction hole and is not suctioned in the second suction hole;

after the first receiving, transferring the substrate to a processing unit to process the substrate in the processing unit;

after the transferring, second advancing the substrate holder with respect to the base such that the substrate holder is located at a second advance position where the substrate holder advances from the base to deliver the substrate while the substrate is suctioned in the second suction hole and not suctioned in the first suction hole; and after the second advancing, second receiving the substrate processed at the processing unit at the second advance position where the substrate holder advances from the base to deliver the substrate while the substrate is suctioned in the second suction hole and not suctioned in the first suction hole.

14. The method according to claim 13, the method further comprising:

providing a first protrusion in the first suction hole in such a way that the first protrusion is pressed by a first elastic member toward an upward direction to protrude from the first suction hole toward the upward direction such that the first protrusion is configured to block the first suction hole in a state where the substrate is not held, and providing a second protrusion in the second suction hole in such a way that the second protrusion is pressed by a second elastic member toward the upward direction to protrude from the second suction hole toward the upward direction such that the second protrusion is configured to block the second suction hole in a state where the substrate is not held.

15. The method according to claim 13, wherein the substrate holder is configured to hold a plurality of substrates simultaneously.

* * * * *